US009322635B2

(12) United States Patent
Blume, Jr. et al.

(10) Patent No.: US 9,322,635 B2
(45) Date of Patent: Apr. 26, 2016

(54) ABSOLUTE POSITIONS DETECTORS

(71) Applicant: Emerson Process Management, Valve Automation, Inc., Waller, TX (US)

(72) Inventors: Doyle Robert Blume, Jr., La Porte, TX (US); Gerald W. Scalf, Houston, TX (US)

(73) Assignee: EMERSON PROCESS MANAGEMENT, VALVE AUTOMATION, INC., Houston, TX (US)

(*) Notice: Subject to any disclaimer, the term of this patent is extended or adjusted under 35 U.S.C. 154(b) by 350 days.

(21) Appl. No.: 13/936,551

(22) Filed: Jul. 8, 2013

(65) Prior Publication Data

US 2015/0008904 A1    Jan. 8, 2015

(51) Int. Cl.
*G01B 7/30*    (2006.01)
*G01R 33/07*    (2006.01)
*G01D 5/04*    (2006.01)

(52) U.S. Cl.
CPC .. *G01B 7/30* (2013.01); *G01D 5/04* (2013.01); *G01R 33/07* (2013.01)

(58) Field of Classification Search
CPC ................................ G01D 5/145; G01D 5/147
USPC ......................................... 324/207.2, 207.25
See application file for complete search history.

(56) References Cited

U.S. PATENT DOCUMENTS

| | | |
|---|---|---|
| RE29,227 E | 5/1977 | Fabish |
| 6,424,928 B1 | 7/2002 | Elliott et al. |
| 6,577,985 B2 | 6/2003 | Scalf |
| 6,615,156 B2 | 9/2003 | Elliott et al. |
| 6,727,614 B2 | 4/2004 | Neubauer et al. |
| 6,878,927 B2 | 4/2005 | Smith et al. |
| 6,992,478 B2 | 1/2006 | Etherington et al. |
| 7,174,795 B2 | 2/2007 | Feng et al. |
| 7,810,282 B2 | 10/2010 | Oxley |
| 7,812,600 B2 * | 10/2010 | Ito et al. ................... 324/207.25 |
| 8,160,205 B2 | 4/2012 | Saracen et al. |
| 2008/0005913 A1 | 1/2008 | Kachouh |
| 2010/0235054 A1* | 9/2010 | Hoskins et al. ................. 701/42 |
| 2012/0119731 A1* | 5/2012 | Deitmerg et al. ........ 324/207.25 |
| 2012/0216413 A1 | 8/2012 | Adegawa |
| 2012/0222604 A1 | 9/2012 | Anderson |
| 2012/0223597 A1 | 9/2012 | Hosek et al. |
| 2012/0268516 A1 | 10/2012 | Saito et al. |

* cited by examiner

*Primary Examiner* — Reena Aurora
(74) *Attorney, Agent, or Firm* — Hanley, Flight & Zimmerman, LLC.

(57) ABSTRACT

Example apparatus for absolute position detection are disclosed. An example apparatus includes a housing and digit gears coupled to the housing to rotate about respective parallel axes. Each digit gear has a first portion including a first set of teeth disposed about an entire circumference of the first portion and a second portion including a second set of teeth disposed about only a portion of a circumference of the second portion. Each digit gear is to correspond to a respective digit in a code representing an absolute position of a shaft. A respective idler gear between each adjacent pair of the digit gears is to be intermeshed with the first set of teeth of one of the digit gears and the second set of teeth of the other one of the digit gears.

18 Claims, 4 Drawing Sheets

ABSOLUTE POSITIONS DETECTORS

FIELD OF THE DISCLOSURE

This disclosure relates generally to position encoders and, more particularly, to absolute position detectors.

BACKGROUND

Absolute position detectors may include interrelated gears and corresponding sensors to monitor rotation of the gears. A positional state of the gears as detected by the sensors may represent an absolute position of, for example, a valve shaft.

Figure 1:
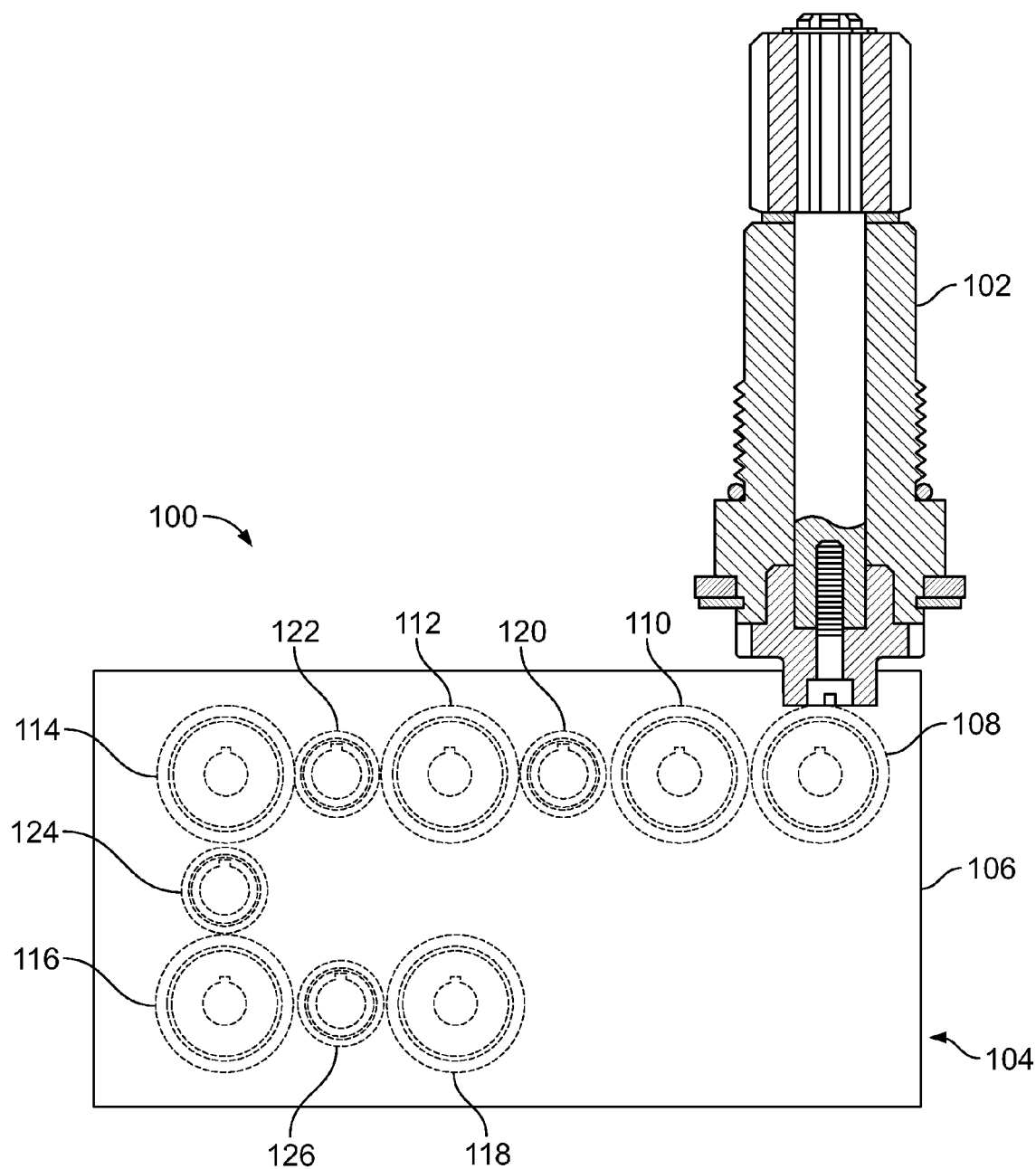
FIG. 1 is a schematic view of an absolute position detector assembly according to one or more aspects of the present disclosure.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

SUMMARY

Absolute position detectors are disclosed. An example apparatus includes a housing and digit gears coupled to the housing to rotate about respective parallel axes. Each digit gear has a first portion with a first set of teeth disposed about an entire circumference of the first portion and a second portion with a second set of teeth disposed about only a portion of a circumference of the second portion. In the example apparatus, each digit gear is to correspond to a respective digit in a code representing an absolute position of a shaft. The example apparatus also includes a respective idler gear between each adjacent pair of the digit gears. Each idler gear is to be intermeshed with the first set of teeth of one of the adjacent pair of the digit gears and the second set of teeth of the other one of the adjacent pair of the digit gears.

Another example apparatus includes a housing and digit gears laterally disposed in the housing. An adjacent pair of the digit gears is inverted with respect to the other one of the adjacent pair of the digit gears. In the example apparatus, one of the adjacent pair of the digit gears is to rotate about a first axis in response to rotation of the other one of the adjacent pair of the digit gears about a second axis. The example apparatus includes a sensors operatively coupled to the housing. The sensors are to detect rotation of the digit gears and to provide signals corresponding to a position.

Another example apparatus includes a housing and a first set of gears disposed in the housing to rotate about respective parallel axes. Each gear in the first set comprises a first indexing portion and a second portion having teeth disposed about an entire circumference of the second portion. The first set of gears is to be used to generate a code representing an absolute position of a shaft.

DETAILED DESCRIPTION

The example apparatus disclosed herein related to absolute position detectors. More specifically, the examples described herein include absolute position detectors having gears in a lateral or generally planar arrangement. In particular, the gears included in the example apparatus rotate about respective parallel axes to generate a code representing an absolute angular position of a shaft. In the example apparatus, each of the gears corresponds to a digit of the code.

Absolute position detectors may be used in connection with a valve assembly having a rotatable shaft. An absolute position detector may monitor positional states of interrelated gears and may employ sensors to detect rotation of the gears. Electrical signal outputs from the sensors may be used to generate a code representative of a position of the valve shaft. Generation of such signals and corresponding encoding techniques related to positional states is described in, for example, U.S. Pat. No. 6,424,928, which is incorporated by reference herein in its entirety.

While some known absolute position detectors incorporate gears arranged to interact with sensor arrays for monitoring angular motion, such absolute position detectors may be limited with respect to resolution or a number of cycles or counts per revolution of the gears implemented in the absolute position detectors. Some absolute position detectors may involve increased complexity of the sensors and/or gears. Further, some absolute position detector gear arrangements may increase the size of a housing in which the gears and corresponding circuitry are provided and, thus, present space concerns when the absolute position detector is incorporated within, for example, a valve actuator assembly.

In accordance with the teachings disclosed herein, a series of digit gears are arranged laterally or in a generally planar manner within a housing such as a gearbox. In some examples, a respective sensor is coupled to each digit gear to generate an electrical signal representative of a positional state (e.g., degrees of rotation) of the corresponding digit gear as the digit gears rotate about parallel axes. A single circuit board may be coupled to the gearbox to receive and process the electrical signals to generate a code indicative of an angular position of an input shaft. An increased number of counts per revolution or resolution may be achieved by incorporating an increased number of digit gears. Incrementing or idler gears having a common design may be interposed between adjacent pairs of digit gears to advance the digit gears.

Turning now to the figures, FIG. 1 depicts an example absolute position detector assembly 100 including a shaft 102 and an absolute position detector 104. The shaft 102 may be a part of, for example, a valve assembly. The absolute position detector 104 includes a plurality of gears disposed in a housing 106 including, for example, an input or drive gear 108; first through fifth digit gears 110, 112, 114, 116, 118; and first through fourth incrementing or idler gears 120, 122, 124, 126. The idler gears 120, 122, 124, 126 are interposed between adjacent pairs of the digit gears 110, 112, 114, 116, 118. As illustrated in FIG. 1, the digit gears 110, 112, 114, 116, 118 and the idler gears 120, 122, 124, 126 are arranged laterally within the housing 106 of the absolute position detector 104. In other words, the gears 110-126 may be mounted in the housing 106 in a generally planar arrangement to rotate about respective parallel axes.

The drive gear 108 rotates with the shaft 102. Rotation of the drive gear 108 rotates the digit gears 110, 112, 114, 116, 118. For example, the drive gear 108 is intermeshed with the first digit gear 110. Rotation of the first digit gear 110 causes the respective first idler gear 120 intermeshed with the first digit gear 110 to rotate. Rotation of the first idler gear 120 advances the next digit gear in a sequence, for example, the second digit gear 112.

The interoperation of the first digit gear 110 with other digit gears 112, 114, 116, 118 and with the drive gear 108 enables counting of revolutions of the shaft 102 and, accordingly, a determination of a positional state of the shaft 102. As the shaft 102 rotates, the drive gear 108 causes the first digit gear 110 to rotate. As the first digit gear 110 completes a rotation, the teeth on the first digit gear 110 intermesh with the teeth on the first idler gear 120 to advance the first idler gear 120, which causes the adjacent second digit gear 112 to rotate. Rotational states of the digit gears 110, 112, 114, 116, 118 may be monitored to determine a position of the shaft 102. In some examples, the position of the shaft 102 corresponds to a valve position.

Figure 2:
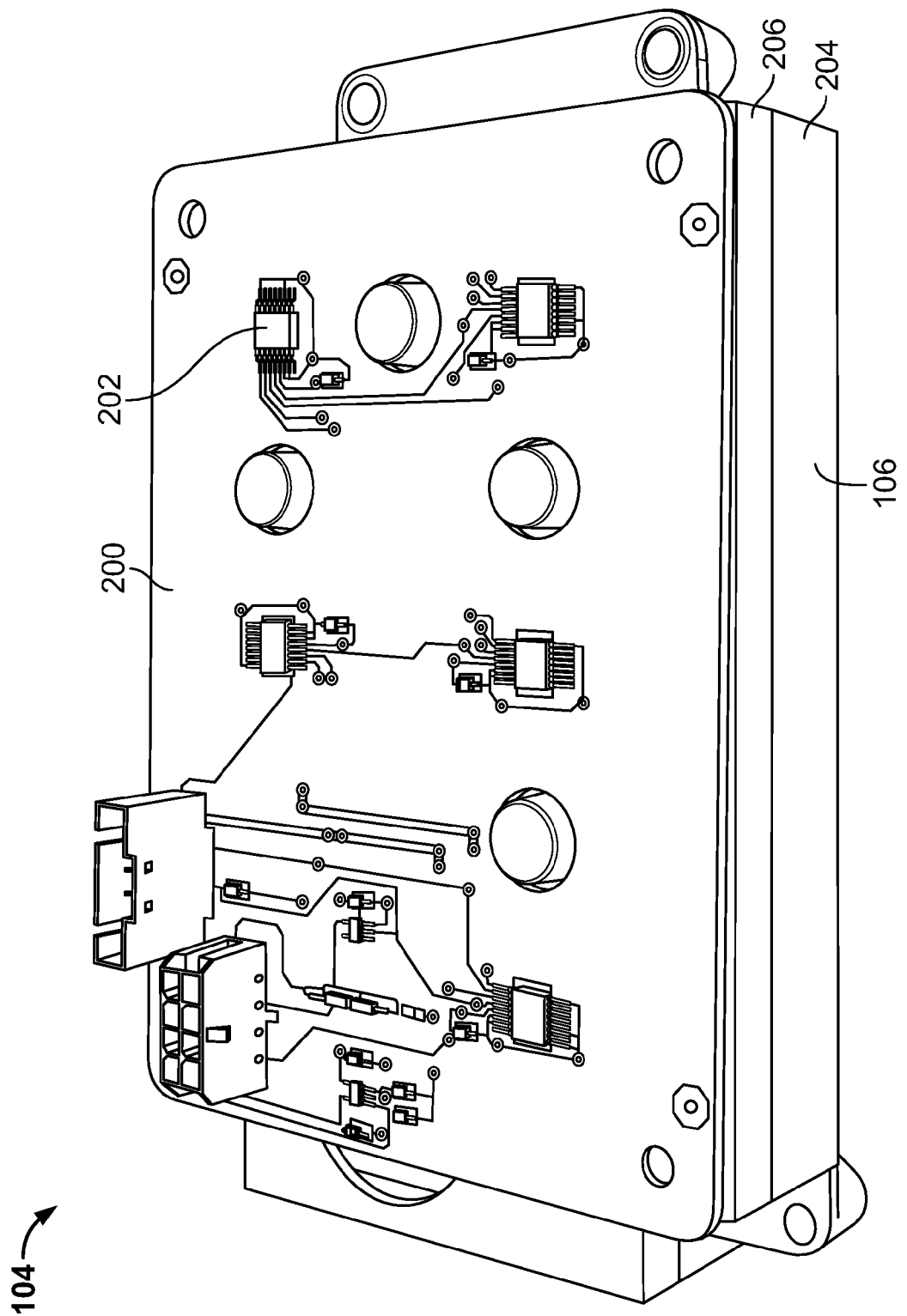
FIG. 2 depicts the absolute position detector of FIG. 1.

FIG. 2 depicts the absolute position detector 104 including the housing 106 and a circuit board 200. The housing 106 may be, for example, a gearbox, having a first housing portion 204 and a second housing portion 206. In some examples, the digit gears 110, 112, 114, 116, 118 are mounted to the first housing portion 204. In some examples, the second housing portion 206 includes an open end of the housing 106. The circuit board 200 includes integrated circuits including analog sensors 202 and digit signal processing components. The circuit board 200 is coupled to the second housing portion 206 such that the respective sensors 202 operatively interact with the digit gears 110, 112, 114, 116, 118 mounted to the first housing portion 204. For example, each of the sensors 202 may detect an angular position of a respective source, such as a magnet, coupled to each of the digit gears in response to angular motion of the digit gears, as will be discussed below. Processing electrical signals generated by the sensors 202 results in a digital signal or code that represents an absolute position of the shaft 102, with each of the digit gears 110, 112, 114, 116, 118 corresponding to a digit in the code.

Figure 3:
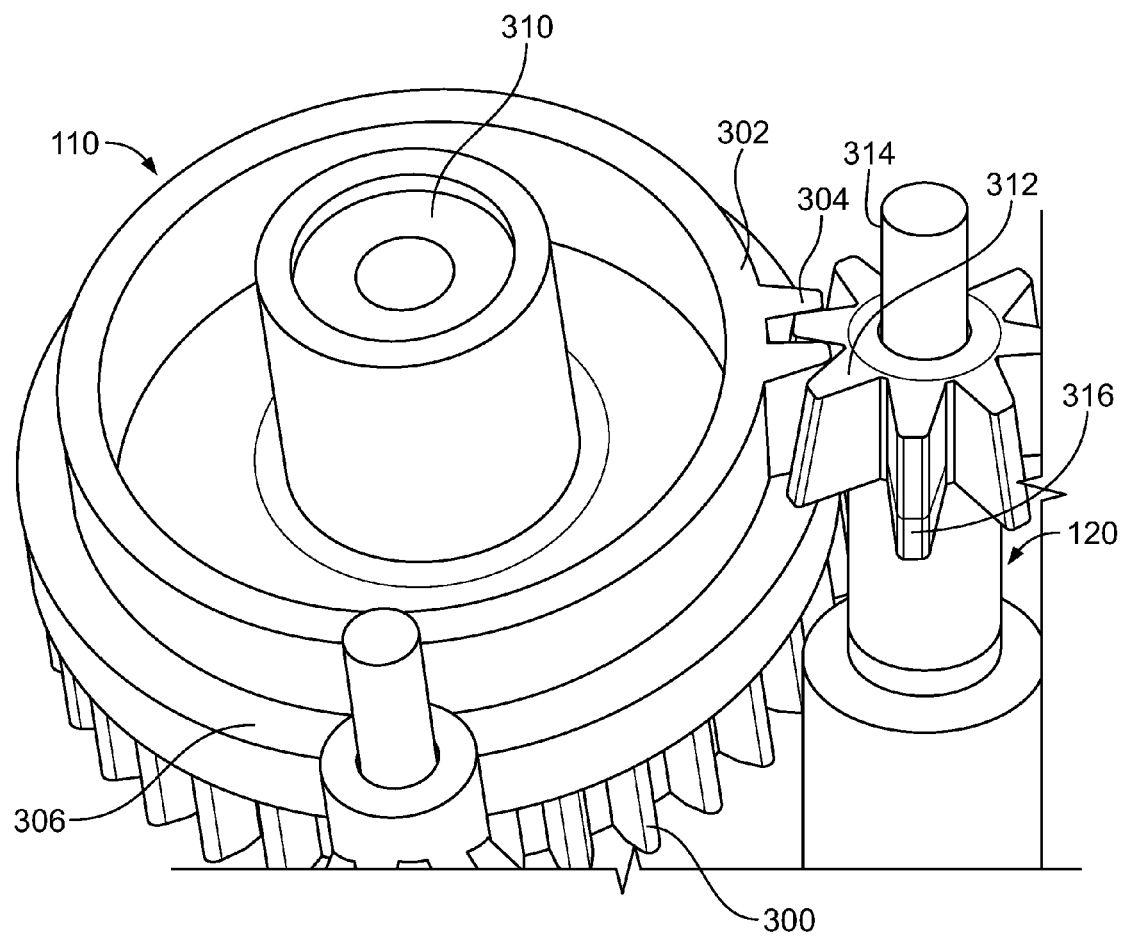
FIG. 3 is a partial cutaway view of the absolute position detector of FIGS. 1 and 2.

FIG. 3 is a partial cutaway view of the absolute position detector 104 of FIGS. 1 and 2. In particular, FIG. 3 shows the example first digit gear 110 and the example first idler gear 120. The first digit gear 110 may include, in some examples, a first portion 300 and a second portion 302. In some examples, the first digit gear 110 is a compound gear such that the first portion 300 functions as a first gear and the second portion 302 functions as a second gear. The first portion 300 has teeth positioned around the entire circumference of the first portion 300. In some examples, the first portion 300 includes at least thirty-two teeth positioned around the circumference. However, any other number of teeth may be used. The second portion 302 includes teeth 304 positioned around only a section or portion the circumference of the second portion 302. For example, the second portion 302 may include two teeth 304 positioned proximate to one another. In some examples, the second portion 302 is an indexing or incrementing portion such that when the teeth 304 of the second indexing portion 302 intermesh with the teeth of the first idler gear 120, the first idler gear 120 advances or rotates its position (e.g., an angular position) an amount corresponding to a number of teeth 304 of the second indexing portion 302.

In some examples, the first digit gear 110 includes a third portion 306, or ring, positioned between the first portion 300 and the second portion 302. The third portion 306 is a locking ring or anti-backlash ring that prevents the first idler gear 120 from back driving the first digit gear 110. In some examples, the first portion 300, the second portion 302, and the third portion 306 are supported by a digit gear shaft. In other examples, the first digit gear 110 includes bearing surfaces proximate to the first housing portion 204 and the second housing portion 206 for mounting the first digit gear 110 in the housing 106 (FIG. 2). In some examples, the first housing portion 204 and the second housing portion 206 include openings for mating the bearing surfaces with the housing 106.

The second through fifth digit gears 112, 114, 116, 118 include identical or substantially identical portions as the first digit gear 110, including the first portion 300, the second portion 302, the third portion 306, and the digit gear shaft and/or bearing surfaces. Accordingly, the same reference numbers will be used when referring to the respective portions of the second through fifth digit gears 112, 114, 116, 118.

As described above with respect to FIG. 2, a respective sensor 202 detects an angular position of a source coupled to the first digit gear 110 in response to angular motion or rotation of the first digit gear 110. In some examples, the source is a magnet 310 disposed on the first digit gear 110. In further examples, the magnet 310 is attached to or inserted into the first digit gear 110 proximate to a center of the first digit gear 110. In further examples, the magnet 310 is coupled to the first digit gear 110 such that the magnet 310 is proximate to the second housing portion 206 and, thus, proximate to the sensors 202 of the circuit board 200 shown in FIG. 2. The magnet 310 may be coupled to the first digit gear 110 such that the polarization of the magnet is perpendicular to an axis about which the first digit gear 110 rotates.

A respective magnet 310 is operatively coupled to the digit gears 112, 114, 116, and 118 as described with respect to the first digit gear 110. In some examples, the sensors 202 include Hall Effect sensors to detect the angular position of the magnets 310 as the digit gears 110, 112, 114, 116, and 118 rotate and to provide respective output signals. In some examples, the sensors 202 provide for absolute angular position measurements of the magnets 310 with 8-bit resolution. Higher resolutions, including 10, 12, or 14 bit resolution, may also be achieved. Although the foregoing description describes detecting positional states using the magnets 310 as the sources and integrated Hall Effect devices as the sensors 202, other absolute position detection encoding systems, including, for example, optical encoders, may be implemented with the absolute position detector assembly 100.

As further illustrated in FIG. 3, the digit gear 110 is intermeshed with the first idler gear 120. The first idler gear 120 includes a first idler gear portion 312 having teeth around an entire circumference of the gear portion 312. An idler gear shaft 314 supports the first idler gear 120. In some examples, the first idler gear portion 312 includes eight teeth, each of the teeth of the first idler gear portion 312 having a first face width, or length. However, any other number of teeth may be used. In further examples, the first idler gear 120 includes a second idler gear portion 316. The second idler gear portion 316 includes a respective tooth associated with every other tooth of the first idler gear portion 312 such that the second idler gear portion 316 extends the face width of every other tooth of the first idler gear portion 312 to a second length. The space width between the teeth associated with the second idler gear portion 316 allows the third portion 306, or ring, of the first digit gear 110 to tangentially engage with a pitch line of the second idler gear portion 316. This engagement or interlocking of the third portion 306 of the first digit gear 110 with the second idler gear portion 316 of the idler gear 120 prevents back driving of the first digit gear 110 while the first digit gear 110 is waiting for subsequent indexing cycles in which the teeth 304 of the second indexing portion 302 intermesh with the teeth of the first idler gear portion 312 of the first idler gear 120.

The second through fourth idler gears 122, 124, 126 include identical or substantially identical portions as the first idler gear 120, including the first idler gear portion 312, the idler gear shaft 314, and the second idler gear portion 316. Accordingly, the same reference numbers will be used when referring to the respective portions of the second through fourth idler gears 122, 124, 126.

Figure 4:
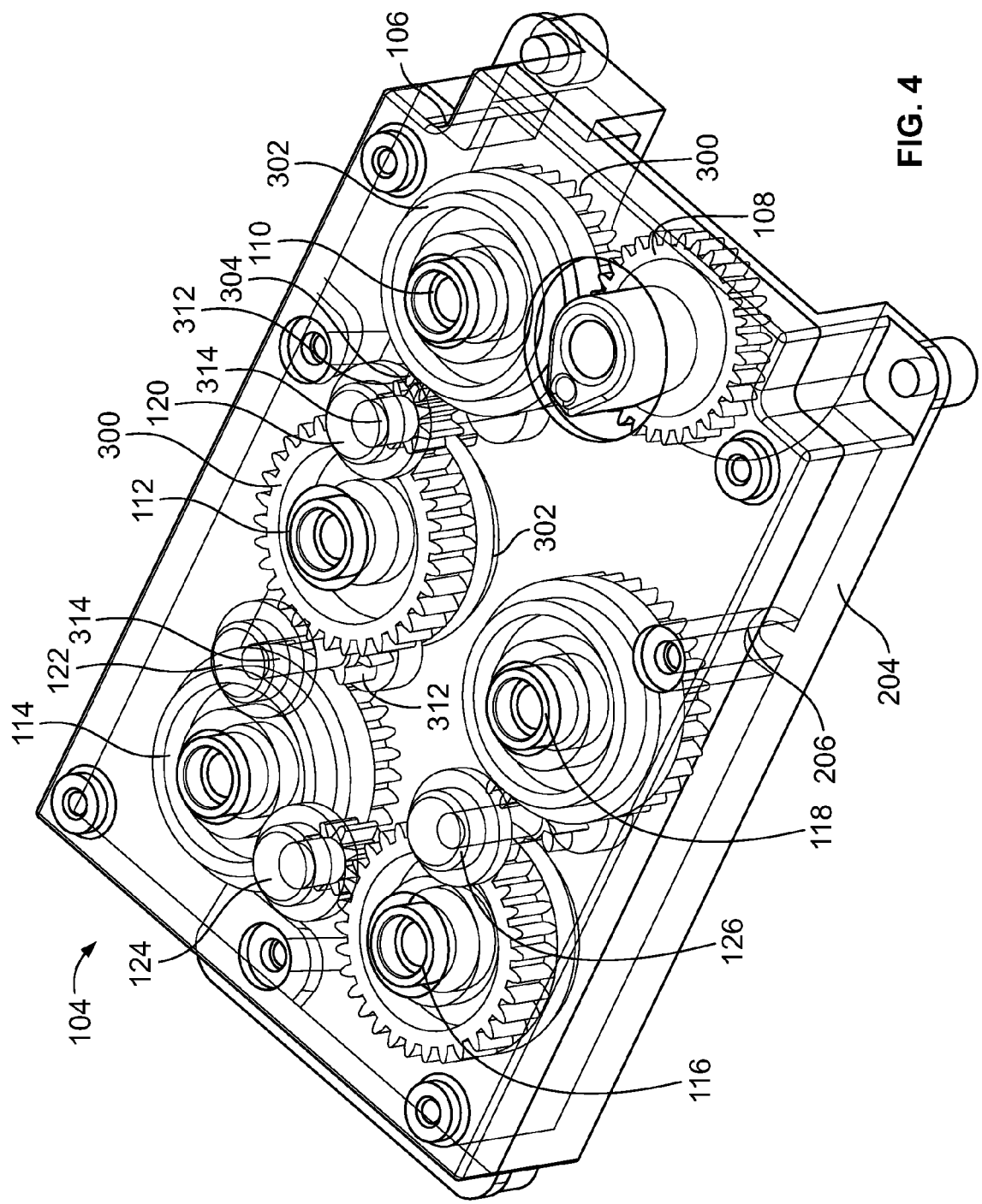
FIG. 4 depicts an arrangement of the gears of the absolute position detector of FIGS. 1 and 2.

FIG. 4 depicts an arrangement of the gears 110-126 of the absolute position detector 104 of FIGS. 1 and 2. As shown in FIG. 4, the gears 108-126 are mounted to the second housing portion 206 in a lateral or generally planar arrangement such that gears 108-126 rotate about respective parallel axes.

As an example of an operation of the gears 108-126 in the generally planar gear arrangement, FIG. 4 depicts an example adjacent pair of digit gears including the first digit gear 110 and the second digit gear 112. In FIG. 4, the first digit gear 110 is orientated within the housing 106 such that second indexing portion 302 is proximate to the second housing end 206. The first portion 300 of the first digit gear 110 having teeth around the entire circumference is proximate to the first housing end 204 of the housing 106. The first portion 300 and the second portion 302 of the first digit gear 110 rotate in response to rotation of the drive gear 108.

The first idler gear 120 is intermeshed with the first digit gear 110. The first idler gear 120 is oriented such that the gear portion 312 of the first idler gear 120 is intermeshed with the second indexing portion 302 of the first digit gear 110. As the second indexing portion 302 of the first digit gear 110 rotates, the teeth 304 of the second indexing portion 302 intermesh with the teeth of the gear portion 312 of the first idler gear 120. The gear portion 312 of first idler gear 120 advances a number of teeth corresponding to the number of teeth 304 of the first digit gear 110. For example, the second indexing portion 302 of the first digit gear 110 may include two teeth 304. The two teeth 304 intermesh with the gear portion 312 of the first idler gear 120 to advance the gear portion 312 two teeth per one complete rotation of the second indexing portion 302 of the first digit gear 110.

The first idler gear 120 is also intermeshed with the second digit gear 112 of the adjacent pair of digit gears 110, 112. As the first idler gear 120 rotates in response to rotation of the first digit gear 110, the first idler gear 120 causes the second digit gear 112 to rotate. For example, the first idler gear 120 advances or increments the second digit gear 112 a number of teeth corresponding to the number of teeth 304 associated with the second indexing portion 302 of the first digit gear per one complete rotation of the second indexing portion 302 of the first digit gear 110. Rotation of the first portion 300 of the second digit gear 112 causes rotation of the second indexing portion 302 of the second digit gear 112. In such a manner, the adjacent pair of the digit gears 110, 112 communicatively rotates in response to rotation of the drive gear 108.

To advance the second digit gear 112, the first idler gear 120 is intermeshed with the first portion 300 of the second digit gear 112 having teeth around the entire circumference. For the first idler gear 120 to intermesh with both the second indexing portion 302 of the first digit gear 110 and the first portion 300 of the second digit gear 112, the digit gears 110, 112 are inversely oriented with respect to each other.

For example, the second digit gear 112 is oriented within the housing 106 such that the first portion 300 is proximate to the second housing end 206 and the second indexing portion 302 is proximate to the first housing end 204. Thus, the second digit gear 112 inverted with respect to the other digit gear 110 of the adjacent pair of digit gears 110, 112.

FIG. 4 depicts other adjacent pairs of the digit gears 112, 114, 116, 118. As described with respect to the adjacent pair including the first digit gear 110 and the second digit gear 112, the other adjacent pairs of the digit gears 112, 114, 116, 118 have idler gears 122, 124, 126 interposed between the respective pairs of the digit gears 112, 114, 116, 118. Additionally, the digit gears 112, 114, 116, 118 making up the adjacent pairs include one digit gear oriented with the first portion 300 proximate to the first housing end 204 and the other digit gear of the pair oriented with the second indexing portion 302 proximate to the first housing end 204.

In some examples, the digit gears 110, 112, 114, 116, 118 are arranged in an alternating orientation such that every other digit gear 110, 112, 114, 116, 118 may be considered inverted with respect to adjacent digit gears 110, 112, 114, 116, 118. For example, as shown in FIG. 4, the digit gears 110, 114, 118 are oriented such that the second indexing portion 302 is proximate to the second housing end 206 and the digit gears 112, 116 are oriented such that the first portion 300 is proximate to the first housing end 204.

The gear portions 312 of the idler gears 120, 122, 124, 126 intermesh with the respective first portions 300 of one of the digit gears 110, 112, 114, 116, 118 and the second indexing portions 302 of another of the digit gears 110, 112, 114, 116, 118. The gear portions 312 of the idler gears 120, 122, 124, 126 may be supported by the idler gear shafts 314 so as to be proximate to the first housing end 204 or the second housing end 206. The proximity of the gear portion 312 of the idler gears 120, 122, 124, 126 to the first housing end 204 or the second housing end 206 is determined by the proximity the second indexing portion 302 of the digit gears 110, 112, 114, 116, 118 to the first housing end 204 or the second housing end 206. For example, with respect to the adjacent pair formed by the first and second digit gears 110, 112, the second indexing portion 302 of the first digit gear 110 is proximate to the second housing end 206. To intermesh with the second indexing portion 302 of the first digit gear 110, the gear portion 312 of the first idler gear 120 is positioned on the idler gear shaft 314 to be proximate to the second housing end 206.

As a further example, a second adjacent pair of the digit gears includes the second digit gear 112 and the third digit gear 114. The second indexing portion 302 of the second digit gear 112 is proximate to the first housing end 204. As a result, the gear portion 312 of the interposing second idler gear 122 is supported by the idler gear shaft 314 so as to be proximate to the first housing end 204 to intermesh with the second indexing portion 302 of the second digit gear 112. Similarly, the gear portions 312 of the third and fourth idler gears 124, 126 are proximate to either the first housing end 204 or the second housing end 206 depending on the proximity of the second indexing portion 302 of the respective third and fourth digit gears 114, 116 between which the third and fourth idler gears 124, 126 are interposed to the first housing end 204 or the second housing end 206.

In some examples, the gear portions 312 of the idler gears 120, 122, 124, 126 are alternatingly oriented such that the gear portion 312 of every other idler gear in the housing 106 is proximate to the first housing end 204 or the second housing end 206. In such examples, each idler gear 120, 122, 124, 126, including the gear portion 312 and the idler gear shaft 314, may be considered inverted with respect to other idler gears 120, 122, 124, 126. The common design of the idler gears 120, 122, 124, 126 permits any of the idler gears 120, 122, 124, 126 to be interposed between the digit gears 110, 112, 114, 116, 118.

As shown in FIG. 4, five digit gears 110, 112, 114, 116, 118 are disposed in the housing 106 in alternating inverted orientations. However, additional or fewer digit gears may be used to implement the absolute position detector 104. In comparison to some known devices, incorporation of, for example, the five digit gears 110, 112, 114, 116, 118 in the housing 106 provides for an increased cycle count corresponding to an increased number of rotational positions (i.e., a greater resolution) of the digit gears that may be monitored for determination of positional states of, for example, the shaft 102 of FIG. 1.

From the foregoing, it will be appreciated that the above disclosed example apparatus include an absolute position detector having a series of rotatable digit gears that are used to determine an absolute position of a shaft and that are arranged in a generally planar manner in a housing. The generally planar arrangement provides for a reduced profile or thickness of a housing of the absolute position detector. Also, an alternating inverted arrangement of the digit gears provides for a substantially identical gear design to be used for each digit gear while accommodating an increased number of digit gears to provide for an increased resolution in a given housing footprint or size. A sensory communication system includes a respective rotatory position detection source, such as a magnet, operatively coupled to each digit gear and integrated circuits including sensors to detect rotation of the digit gears via movement of the sources and to encode a corresponding positional state. A single circuit board coupled to the housing of the absolute position detector serves to reduce complexity of the absolute position detector relative to many known devices without compromising resolution or accuracy.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus, comprising:
a housing;
digit gears coupled to the housing to rotate about respective parallel axes, each digit gear having a first portion including a first set of teeth disposed about an entire circumference of the first portion, a second portion including a second set of teeth disposed about only a portion of a circumference of the second portion, and a third portion disposed between the first portion and the second portion, the third portion to prevent reverse rotation of the digit gear, each of the digit gears to correspond to a respective digit in a code representing an absolute position of a shaft; and
a respective idler gear between each adjacent pair of the digit gears, each idler gear to be intermeshed with the first set of teeth of one of the adjacent pair of the digit gears and the second set of teeth of the other one of the adjacent pair of the digit gears.

2. The apparatus of claim 1, further comprising a drive gear disposed in the housing and to be coupled to the shaft, the drive gear intermeshed with one of the digit gears.

3. The apparatus of claim 1, further comprising a circuit board coupled to the housing, the circuit board including sensors to detect a position of a respective source operatively coupled to each of the digit gears, the sensors to provide electrical signals to generate the code.

4. The apparatus of claim 3, wherein the sensors comprise Hall Effect sensors.

5. An apparatus, comprising:
a housing;
digit gears coupled to the housing to rotate about respective parallel axes, each digit gear having a first portion including a first set of teeth disposed about an entire circumference of the first portion and a second portion including a second set of teeth disposed about only a portion of a circumference of the second portion, each of the digit gears to correspond to a respective digit in a code representing an absolute position of a shaft; and
a respective idler gear between each adjacent pair of the digit gears, each idler gear to be intermeshed with the first set of teeth of one of the adjacent pair of the digit gears and the second set of teeth of the other one of the adjacent pair of the digit gears, wherein a first one of the idler gears between a first adjacent pair of the digit gears is inverted with respect to a second one of the idler gears between a second adjacent pair of the digit gears.

6. The apparatus of claim 5, wherein the digit gears comprise at least five digit gears.

7. An apparatus, comprising:
a housing;
digit gears laterally disposed in the housing, wherein one of an adjacent pair of the digit gears is inverted with respect to the other one of the adjacent pair of the digit gears, the one of the adjacent pair of the digit gears to rotate about a first axis in response to rotation of the other one of the adjacent pair of the digit gears about a second axis; and
sensors operatively coupled to the housing to detect rotation of the digit gears and to provide signals corresponding to a position.

8. The apparatus of claim 7, further comprising a circuit board coupled to a first end of the housing, the sensors operatively coupled to the circuit board.

9. The apparatus of claim 7, further comprising a respective source operatively coupled to each digit gear, the sensors to detect rotation of the digit gears by detecting rotation of the sources.

10. The apparatus of claim 8, further comprising a respective idler gear intermeshed between each adjacent pair of the digit gears, wherein a first one of the idler gears intermeshed between a first adjacent pair of the digit gears is proximate to the first end of the housing and a second one of the idler gears intermeshed between a second adjacent pair of the digit gears is proximate to the second end of the housing.

11. The apparatus of claim 7, wherein each digit gear comprises a first portion and a second portion, the first portion having a plurality of teeth disposed about an entire circumference of the first portion and the second portion having teeth disposed about only a portion of the circumference of the second portion.

12. The apparatus of claim 11, wherein the first portion of the one of the adjacent pair of the digit gears is proximate to a first end of the housing and the first portion of the other one of the adjacent pair of the digit gears is proximate to a second end of the housing.

13. The apparatus of claim 7, further comprising a drive gear intermeshed with one of the digit gears and coupled to the shaft, the digit gears to rotate in response to rotation of the drive gear.

14. An apparatus, comprising:
a housing;
a first set of gears disposed in the housing to rotate about respective parallel axes, each gear in the first set including a first indexing portion and a second portion having teeth disposed about an entire circumference of the second portion, the first set of gears to be used to generate a code representing an absolute position of a shaft; and a second set of gears, each of the gears in the second set to be interposed between an adjacent pair of the gears in the first set, wherein each gear in the second set is intermeshed with the first indexing portion of one of the adjacent pair of the gears in the first set and the second portion of the other one of the adjacent pair of the gears in the first set.

15. The apparatus of claim 14, further comprising a drive gear disposed in the housing and coupled to the shaft, the drive gear intermeshed with the first indexing portion of one of the gears in the first set.

16. The apparatus of claim 14, wherein each gear in the first set comprises a locking ring, the locking ring disposed between the first indexing portion and the second portion.

17. The apparatus of claim 14, further comprising a respective magnetic source operatively coupled to each gear in the first set, the magnetic sources having polarization perpendicular to the axes.

18. The apparatus of claim 17, further comprising sensors operatively coupled to the housing, the sensors to detect positions of the magnetic sources and to provide corresponding electrical signals to generate the code.

* * * * *